US011057031B1

(12) United States Patent
Bagheri et al.

(10) Patent No.: US 11,057,031 B1
(45) Date of Patent: Jul. 6, 2021

(54) RELIABILITY IN START UP SEQUENCE FOR D-MODE POWER FET DRIVER

(71) Applicant: pSemi Corporation, San Diego, CA (US)

(72) Inventors: Arezu Bagheri, San Diego, CA (US); Buddhika Abesingha, Derry, CA (US); Ronald E. Reedy, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/992,003

(22) Filed: Aug. 12, 2020

(51) Int. Cl.
| | |
|---|---|
| *H02M 1/36* | (2007.01) |
| *H03K 17/22* | (2006.01) |
| *H02M 3/07* | (2006.01) |
| *H02M 1/08* | (2006.01) |
| *H03K 17/06* | (2006.01) |

(52) U.S. Cl.
CPC ............ *H03K 17/223* (2013.01); *H02M 1/08* (2013.01); *H02M 1/36* (2013.01); *H02M 3/07* (2013.01); *H03K 17/063* (2013.01)

(58) Field of Classification Search
CPC ............ H02M 1/08; H02M 1/36; H02M 3/07; H03K 17/063; H03K 17/223
USPC ................................ 327/108, 109, 110, 111
See application file for complete search history.

(56) References Cited

U.S. PATENT DOCUMENTS

| | | | | |
|---|---|---|---|---|
| 2016/0079854 | A1* | 3/2016 | Kinzer .................. | H02M 1/088 323/271 |
| 2020/0153427 | A1* | 5/2020 | Bagheri ........... | H03K 19/09443 |
| 2020/0321849 | A1* | 10/2020 | Sharma ............ | H03K 17/08122 |

OTHER PUBLICATIONS

Non-Final Office Action for U.S. Appl. No. 16/992,001, filed Aug. 12, 2020, on behalf pSemi Corporation, dated Sep. 18, 2020. 5 pages.

* cited by examiner

*Primary Examiner* — William Hernandez
(74) *Attorney, Agent, or Firm* — Steinfl + Bruno LLP

(57) ABSTRACT

Methods and devices to address start up of half-bridge circuits including D-mode power FETs are disclosed. The disclosed devices overcome possible issues of output overload or excess current through gate-source of power FETs during start up. Methods and devices based on monitoring coupling capacitors voltages and pre-charging such coupling capacitors using current sources are also described. The current sources can be implemented using negative voltages provided by negative voltage sources such as charge pumps.

18 Claims, 4 Drawing Sheets

RELIABILITY IN START UP SEQUENCE FOR D-MODE POWER FET DRIVER

CROSS-REFERENCE TO RELATED APPLICATIONS

The present application may be related to U.S. patent application Ser. No. 16/992,001 entitled "Reliability in start up sequence for D-mode power FET driver" and filed on Aug. 12, 2020, the contents of which are incorporated herein by reference in their entirety.

FIELD

The present disclosure is related to D-mode power FET drivers, and more particularly to methods and apparatus providing reliable start up sequences for D-mode power FET drivers.

BACKGROUND

Certain depletion mode (also known as D-mode) power field effect transistors (FETs), especially D-mode FETs, often with HEMT structures, made in SiC, GaN or other compound semiconductor technologies, are good candidates for highly efficient half-bridge architectures due to their improved electrical characteristics such as high mobility, low on-resistance, and low gate capacitance. In this type of FET, the channel is present when the gate-source voltage Vgs is zero. In other words, the depletion-mode FET is normally ON when there is no voltage difference between gate and source. This may cause, for example in a half-bridge architecture, an input-output short and in-rush current at start up. As a consequence, the driver for such FETs may require a controlled start up sequence to avoid a so-called shoot-through current from supply to ground.

With reference to FIGS. 1-4, and throughout this document, the term "start up" is used to describe the start up of the circuit, whether from a cold start (no charge on any capacitors) or from recovery and restart from a disable or fault mode (unknown amount of charge on the various capacitors) and the term "normal operation" is used to describe the normal operation of the circuit as understood in the art.

FIG. 1 shows a prior art electronic circuit (100) including a half-bridge driver (101) comprising high side and low side D-mode FETs (T2, T1), high side and low side drivers (DRV2, DRV1), a low side capacitor ($C_{LS}$), and a high side capacitor ($C_{HS}$). The half-bridge driver (101) further comprises switch FET (T3) coupling input voltage (Vin) to the series connection of high side and low side FETs (T2, T1). Switch FET (T3) is controlled by switch control block (103) and is in ON state during the normal operation of the electronic circuit. However, before starting the normal operation of the circuit, switch FET (T3) is in OFF state to reduce the risk of any possible short from the input voltage (Vin) to ground.

High side capacitor ($C_{HS}$) is known as a bootstrap capacitor which is charged to Vdd through diode (D1) when the SW node is at or below Vdd. After the start up sequence, i.e. during normal operation, high side capacitor ($C_{HS}$) is used to power the driver (DRV2) as the half-bridge switch node (SW) transitions from LOW (zero Volts in this case) to HIGH (Vin in this case). Low side driver (DRV1) drives low side FET (T1) with respect to ground, while high side driver (DRV2) drives high side FET (T2) with respect to its source which is connected directly to switch node (SW). In other words, the effective ground of high side driver (DRV2) is connected to switch node (SW).

Based on the above, generally a sufficiently negative voltage needs to be applied to the D-mode FETs in order to turn them OFF reliably. As part of the start up sequence, before starting the normal operation of the circuit (100), half-bridge driver (101) of FIG. 1 typically implements so-called "dummy" cycles to charge coupling capacitors (C1, C2) that are respectively inserted between their corresponding drivers (DRV1, DRV2) and power FETs (T1, T2). Coupling capacitors (C1, C2) provide, for example, a 5V voltage drop for level shifting from a 0 to 5V range to a −5 to 0V range, to ensure a reliable OFF state of power FETs (T1, T2) before normal operation of the electronic circuit (100). The dummy cycles typically include series pulses with 50% duty cycle that are applied before turning ON switch FET (T3). This is performed to ensure that power FETs (T1, T2) may be reliably placed in an OFF state before starting the normal operation.

As known to the person skilled in the art, during normal operation, the gate of the power FETs (T1, T2) are driven to HIGH and LOW states with respect to ground and SW node respectively, in an alternating fashion, by their respective drivers (DRV1, DRV2). As a result, the signal appearing at switch node (SW) is a square wave signal. Switch node (SW) is connected to filter (102) including a series combination of inductor (Lout) and capacitor (Cout). As an example, the inductance (Lout) and the capacitance (Cout) may be chosen such that filter (102) functions as a low pass filter, filtering all the harmonics of the square wave signal at switch node (SW) to produce a direct current (DC) output, indicated by voltage (Vout). The ratio of the output DC signal to input voltage (Vin) will then depend on the duty cycle of the square wave signal. DC voltage (Vout) is used to feed voltage sensitive circuit (104) which may include voltage sensitive elements (e.g. FPGAs, microprocessors, etc.). As an example, Vout may feed circuits that can tolerate only 1 to 2 V, while input voltage (Vin) may be around 12 V or many 10's or 100's of volts, depending on the application. In other words, circuit (100), and more in particular the start up sequence, should be carefully designed to ensure that Vout does not exceed the maximum tolerable voltage of the voltage sensitive circuit (104), no matter what state circuit (100) is in.

Also shown in FIG. 1 is bypass capacitor (Cb) connected at one end to switch FET (T3), and to a reference voltage, e.g. ground, at another end. Bypass capacitor (Cb) is typically a large capacitor carrying DC voltage (Vdc). Depending on the state of circuit (100), DC voltage (Vdc) may be as high as or close to input voltage (Vin), e.g. up to 12 Volts.

Designing the half-bridge driver (101) of FIG. 1 using D-mode power FETs poses various challenges, especially during the start up. As an example, when recovering from a fault or disable mode, power FETs (T1, T2) may be undesirably in ON or close to ON state (for example during dummy cycles to recharge coupling capacitors C1 and C2), thus passing DC voltage (Vdc) to output node (105) which may overload and damage the voltage sensitive circuit (104) connected to output node (105). As a consequence, Vdc may be close to Vin (e.g. 12V) and this may damage the constituent electronic elements of the circuit (104) which may not be able to tolerate more than 1 to 2 V.

With further reference to FIG. 1, implementing the dummy cycles as described may also cause the issue of uncontrolled charging current of coupling capacitors (C1, C2) and possibly damaging gate-source junctions of power FETs (T1, T2).

In view of the above, mainly due to the fact that D-mode power FETs need sufficiently high negative voltage to turn reliably OFF, there are two potential issues with the existing solutions for starting up a half-bridge driver implementing D-mode power FETS:

Possible output voltage overload causing possible damages to other circuits connected to the output of the half-bridge driver; and Possible damages to gate-source junctions of D-mode power FETs due to uncontrolled charging current of coupling capacitors connected to gate terminals of the D-mode power FETs implemented in the design of the half-bridge driver.

Solutions are therefore needed to make sure that, at any time, and regardless of the state circuit (100) of FIG. 1 is in, power FETs (T1, T2) do not turn ON undesirably and in an uncontrolled way, thus resulting in possible damages to other circuits connected to such circuit.

SUMMARY

The disclosed methods and devices address the above-mentioned challenges and provide solutions to the described issues above.

According to a first aspect of the present disclosure, an electronic circuit configured to receive an input DC voltage is provided, comprising: a high side driver and a low side driver; a high side depletion mode field effect transistor (FET) connected to a low side depletion mode FET at a switch node; a high side coupling capacitor coupling the high side driver to the high side depletion mode FET, and a low side coupling capacitor coupling the low side driver to the low side depletion mode FET; a FET switch configured to couple the input DC voltage to the high side depletion mode FET; a bypass capacitor connected to the FET switch and the high side depletion mode FET at one end and to a reference voltage at another end; a first transistor connected to the high side depletion mode FET and the high side coupling capacitor at one end and connectable to a first supply voltage at another end; and a second transistor connected to the low side depletion mode FET and the low side coupling capacitor at one end and connectable to a second supply voltage at another end; wherein in a first state: the FET switch is in an OFF state, thereby electrically isolating the input DC voltage from the high side depletion mode FET; the first transistor is in an ON state, thereby charging the high side coupling capacitor; and the second transistor is in ON state, thereby charging the low side coupling capacitor.

According to a second aspect of the present disclosure, a method of starting up or restarting a circuit configured to receive an input DC voltage is disclosed, the circuit comprising: a high side depletion mode FET connected to a low side depletion mode FET at a switch node; a high side coupling capacitor connected to the high side depletion mode FET at one end and to a high side driver at another end; a low side coupling capacitor connected to the low side depletion mode FET at one end and to a low side driver at another end; and a FET switch connected to the input DC voltage at a first end and to the high side depletion mode FET at a second end, the method comprising: turning the FET switch off; monitoring a DC voltage at the second end; based on the monitoring, when the DC voltage at the second end is less than a threshold voltage: charging the high side coupling capacitor thereby enabling the high side driver to control the high side depletion mode FET to be in an OFF state; and charging the low side coupling capacitor thereby enabling the low side driver to control the low side depletion mode FET to be in an OFF state Further aspects of the disclosure are provided in the description, drawings and claims of the present application.

DETAILED DESCRIPTION

Figure 1:
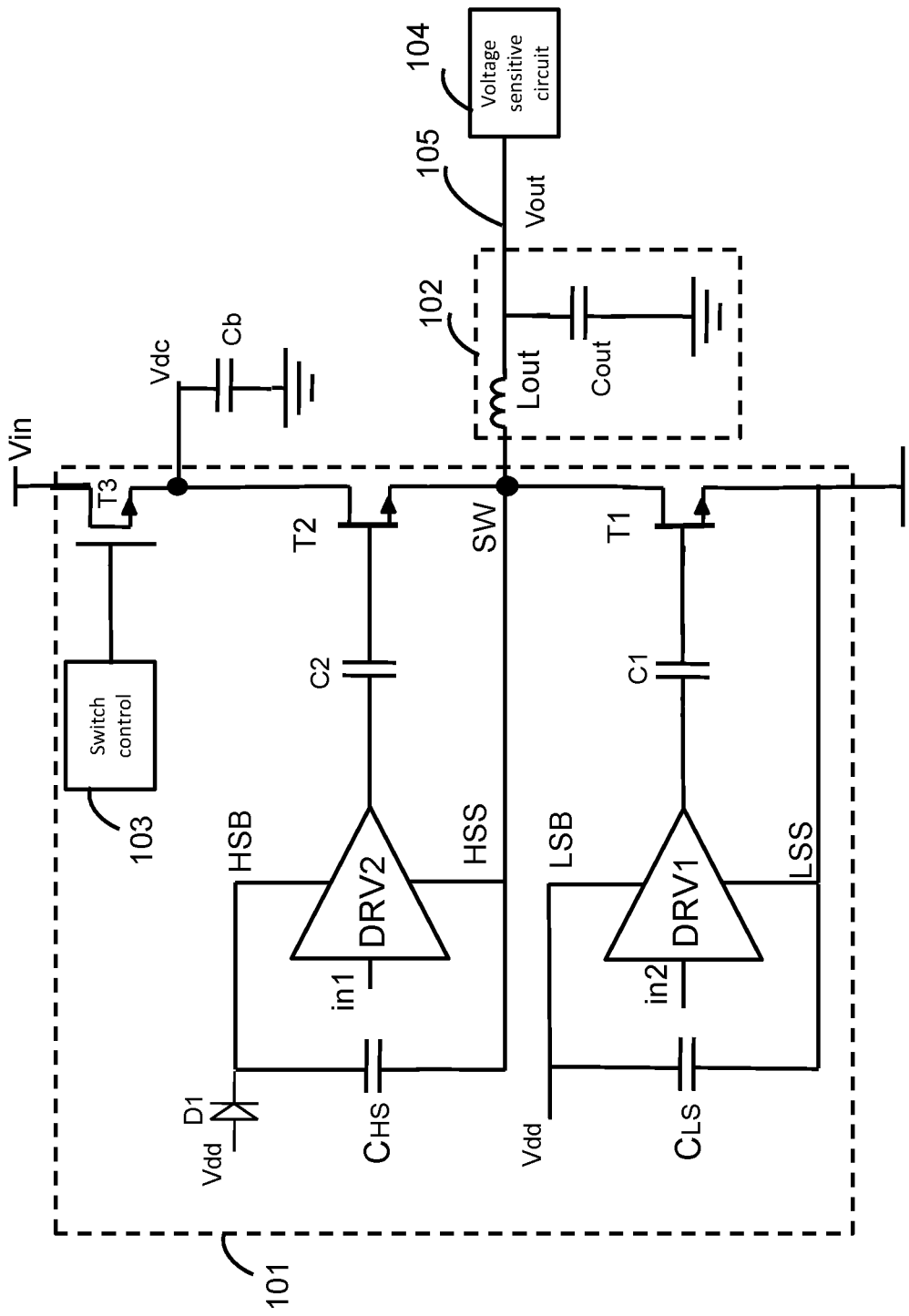
FIG. 1 shows a prior art circuit including a half-bridge driver.
Figure 2:
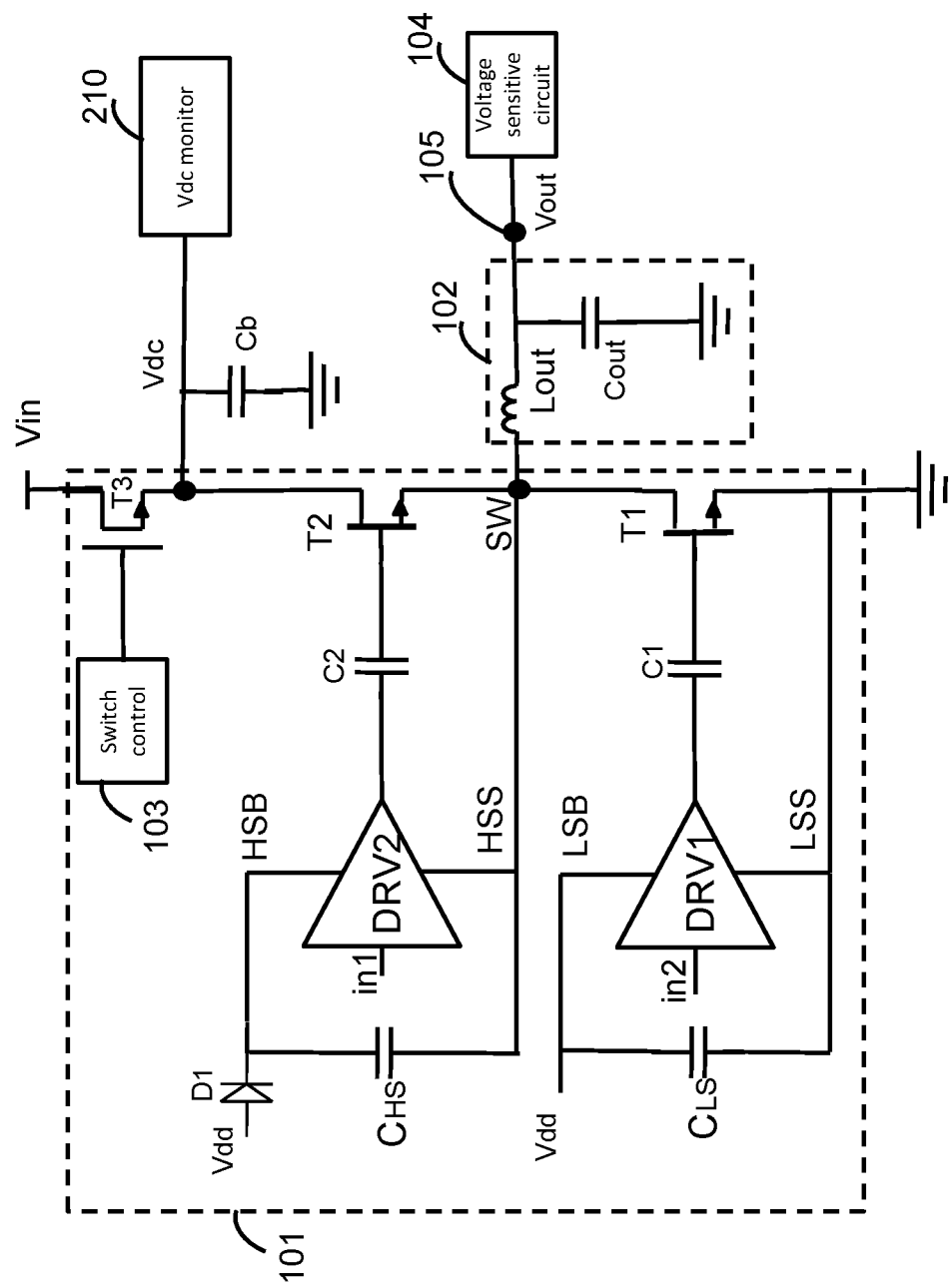
FIGS. 2-4 show exemplary circuits including half-bridge drivers according to embodiments of the present disclosure.

FIG. 2 shows a circuit (200) in accordance with an embodiment of the present disclosure. During normal operation, the principle of operation of circuit (200) is similar to what was described with regards to circuit (100) of FIG. 1. Circuit (200) of FIG. 2 comprises a voltage monitor (210). Referring back to FIG. 1, in a typical start up process, switch FET (T3) is turned OFF before initiating the dummy cycles to charge coupling capacitors (C1, C2). In this way, power FETs (T1, T2) are isolated from input voltage (Vin), thus avoiding excess current shooting through power FETs (T1, T2). Voltage monitor (210) may consist of high-voltage monitoring circuits and methods known in the prior art, for example a combination of a voltage divider, to bring down the sensed voltage to a safe level for the monitor circuit, and a Schmitt trigger.

With reference now to FIG. 2, during start up, voltage monitor (210) monitors DC voltage (Vdc) to ensure such a voltage is lower than a set threshold voltage before initiating the dummy cycles, which may have a 50% duty cycle. This is performed to protect the circuit elements of the voltage sensitive circuit (104) by avoiding any undesired effects such as over-voltage of output node (105), or damaging shoot-through current through transistors T1 & T2, regardless of the state of circuit (200). By way of example and not of limitation, input voltage (Vin) may be 12 V, and DC voltage (Vdc) may be close to (Vin) or greater than a maximum voltage (e.g. 2V) tolerable by voltage sensitive circuit (104). At a given instant, for example when circuit (200) is returning from a fault or disable mode, the voltage on the right plane of the coupling capacitor (C1) may not be sufficiently negative to keep power FET (T2) in a reliable OFF state. As a result, DC voltage (Vdc) is coupled to output node (105) through power FET (T1) being partially or fully ON, thus potentially damaging the voltage sensitive circuit (104). Similarly, voltages on both coupling capacitors C1 & C2 may be such that both power FETs T1 & T2 may be in ON states, thereby creating large shoot-through currents of stored charge on Cb. According to embodiments of the present disclosure, the set threshold voltage can be adjustable or programmable. Also, even if there is enough charge on the capacitors C1 and C2 to maintain sufficiently negative voltage on the gates of FETs T1 and T2, initiating the 50% duty dummy cycles before it is safe, as indicated by the Vdc monitor, can cause overvoltage on node (105) and damage the circuit (104).

With continued reference to FIG. 2, the set threshold voltage of Vdc monitor (210) is chosen based on the maximum tolerable voltage of voltage sensitive circuit (104), e.g. less than or equal to 2V for the mentioned example. According to further embodiments of the disclosure, once voltage monitor (210) confirms that DC voltage (Vdc) is equal to or below the set threshold voltage, the dummy cycles may be initiated to start charging the coupling capacitors (C1, C2) to a voltage level that is sufficiently negative to keep power FETs (T1, T2) in a reliable OFF state.

As mentioned previously, depending on the application, in half-bridge circuits implementing dummy cycles as part of the start up, and uncontrolled charging of the coupling capacitors may result in damages to the gate-source junctions of the power FETs.

Figure 3:
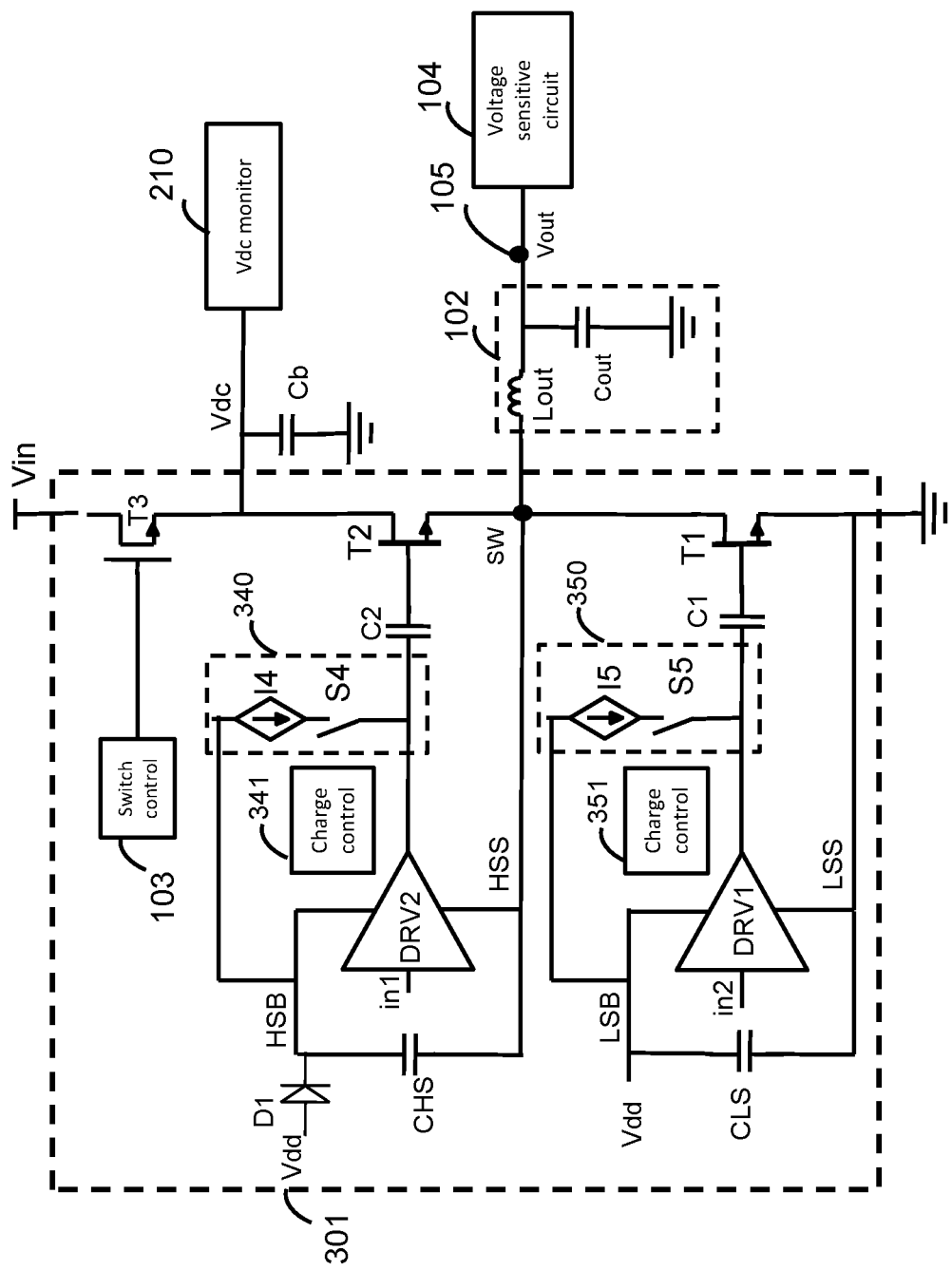

FIG. 3 shows an exemplary circuit (300) comprising half-bridge driver (301) in accordance with further embodiments of the present disclosure. Half-bridge driver (301) includes switchable current sources (340, 350) used to charge the coupling capacitors (C1, C2) during the start up process. As shown in the figure, the switchable current source (340) may comprise a series combination of a current source (I4) and switch (S4), and current source (350) may comprise a series combination of a current source (I5) and switch (S5). The value of current sources (I4 & I5) is set to ensure no damage occurs to the gate-source structure of power FETs (T2 & T1) since these charging currents must flow through those gate-source structures. The current sources (I4, I5) can be realized using well known circuits in the prior art and can even take the form or other devices like a resistor through which a current could be made to flow. Similarly the switches (S4, S5) can be realized using well known devices in prior art including p-type or n-type FET transistors. The states of switches (S4, S5) are controlled by charge control devices (341, 351) respectively. According to embodiments of the present disclosure, switches (S4, S5) are in the OFF state during normal operation of circuit (300). In other words, during the normal operation, the principle of operations of circuit (300) is similar to what was previously described with regards to circuits (100, 200) of FIGS. 1-2. According to embodiments of the present disclosure, current sources (I4) and/or (I5) may be implemented using a series combination of a transistor and a resistor. According to further embodiments of the present disclosure, current sources (I4) and/or (I5) may be implemented using a current mirror.

With continued reference to FIG. 3, the combination of the current sources (340, 350) replaces the functionality of the previously described dummy cycles. During start up, switches (S4, S5) are turned ON by the charge control devices (341, 351) to charge the corresponding coupling capacitors (C2, C1). The currents used to charge the coupling capacitors (C2, C1) are limited by the current sources (I4, I5), thus avoiding possible damages to gate-source junctions of the power D-mode FETs (T1, T2), which would have been possible in the case of an implementation with dummy cycles. The current charging coupling capacitor (C2) is supplied by bootstrap high side capacitor ($C_{HS}$) which is in turn charged by its connection to Vdd through diode D1.

Implementation of the Vdc monitor (210) of FIG. 3 is required. In the embodiments where the Vdc monitor (210) is implemented, current sources (340, 350) may be turned ON only after DC voltage (Vdc) is confirmed to be less than or equal to a set threshold voltage in a similar way as was described with regards to circuit (200) of FIG. 2. The gate-source diodes of power FETs (T1, T2) clamp the voltages on the right plane of the coupling capacitors (C1, C2) to the threshold voltage of such diodes (e.g. 0.7V). According to the teachings of the present disclosure, low-side and high-side drivers (DRV1, DRV2) may be put in a high-impedance mode while their respective coupling capacitors (CLS, CHS) are being charged during the start up process.

Figure 4:
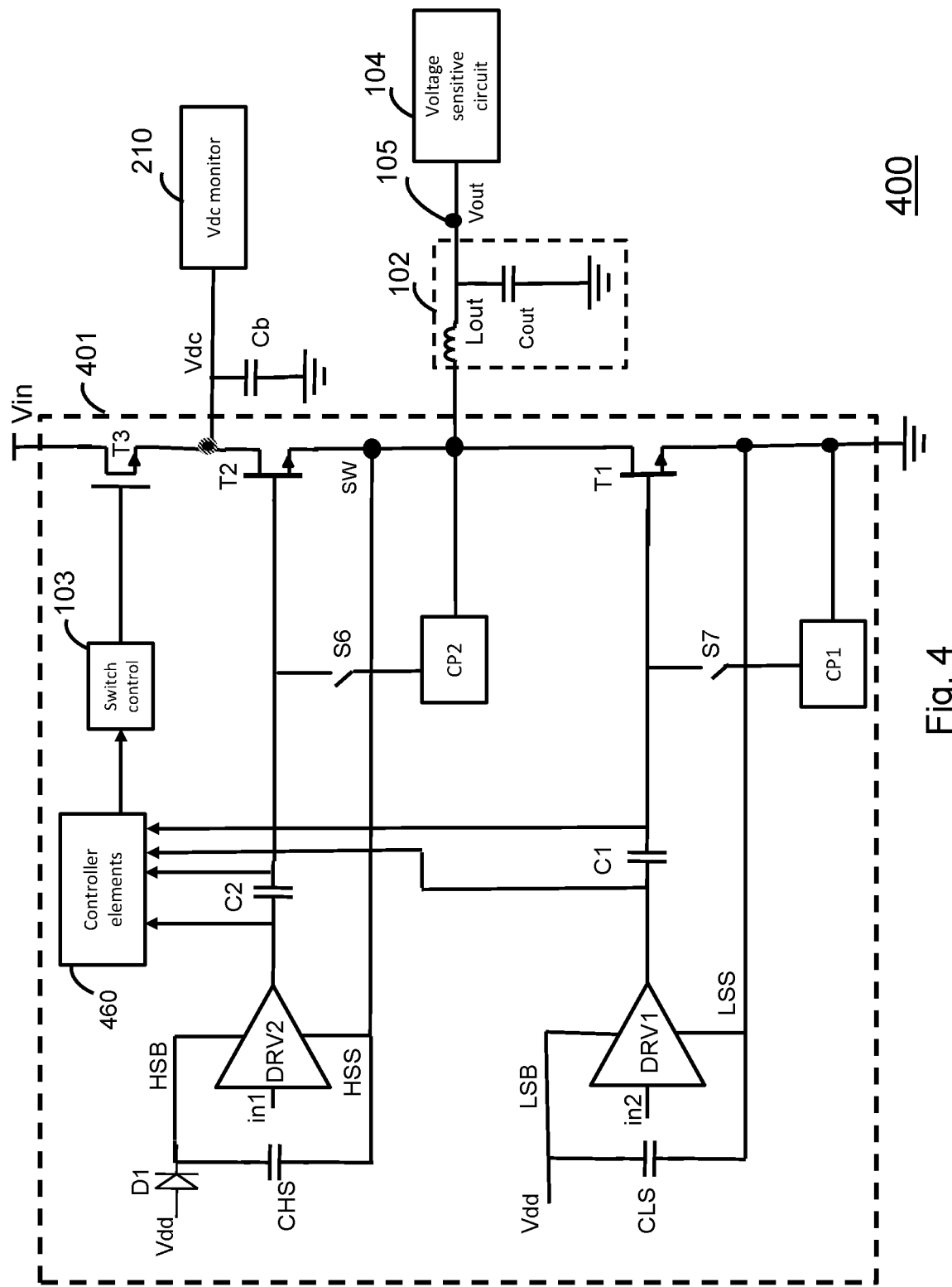

FIG. 4 shows an exemplary circuit (400) according to a further embodiment of the disclosure. Half-bridge driver (401) includes switches (S6, S7) used to charge, during start up, coupling capacitors (C1, C2) respectively. The switches (S6, S7) are connectable to power supply circuits (CP1, CP2) providing a negative voltage (e.g. −5V) with respect to the ground reference of such circuits. The power supply circuits (CP1, CP2) may comprise one or more charge pumps, which are known as such to the person skilled in the art and will not be discussed herein in detail. Moreover, power supply circuits (CP1, CP2) and the rest of the elements of half-bridge driver (401) may be implemented on the same chip or on separate chips. Switches (S6, S7) are controlled by controller circuit (460), which is configured to turn switches (S6, S7) into an ON state during start up, thereby providing sufficient negative voltages to gate terminals of corresponding D-mode power FETs (T1, T2) to ensure that such transistors are in a reliable OFF state during start up. This prevents possible overloading of output node (105) or other issues as described previously. The control signals provided by controller (460) to the switches (S6, S7) are level shifted to properly operate with the negative voltages provided by the power supply circuitry (CP1, CP2). By way of example, if power supply circuits (CP1, CP2) are at −5V, the mentioned control signals are level shifted from 0 to −5V. According to embodiments of the present disclosure, power supply circuits (CP1, CP2) and With continued reference to FIG. 4, in order to charge up the coupling capacitors (C1, C2) during start-up, the negative power supply circuits (CP1, CP2) are connected to one side of the capacitors through switches (S6, S7), and the respective driver (DRV1 for CP1 and DRV2 for CP2) forces 0V with respect to the driver's ground reference (GND for DRV1 and SW for DRV2) on the other side of the capacitors. This causes the coupling capacitors to charge-up by drawing current from drivers' ground references and into the respective negative power supplies (CP1 for C1, and CP2 for C2). A person skilled in the art will appreciate that the charging currents do not pass through the gate-source junctions of the power FETs (T1, T2) as was the case for the embodiment described above and in FIG. 3 and, as a result, the issue of excess current potentially damaging the gate-source junctions of power FET (T1, T2) is overcome. Moreover, by virtue of not having controlled current source(s) to limit the charging currents, faster charging of the coupling capacitors (C1, C2) is made possible, resulting in a faster start up without undesired delays. According to embodiments of the present disclosure, the controller (460) senses the voltage across the coupling capacitors (C1, C2) to determine when to turn OFF the switches (S6, S7). When the coupling capacitors (C1, C2) are sufficiently charged to reliably keep the power FETs (T1, T2) in the OFF state, switches (S6, S7) are turned OFF. Additionally, the controller (460) issues a signal to the switch control (103) to turn transistor (T3) ON so that the normal operation of the circuit (400) can be initiated.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, bipolar-CMOS-DMOS (BCD), GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The invention claimed is:

1. An electronic circuit configured to receive an input DC voltage, the electronic circuit comprising:
a high side driver and a low side driver;
a high side depletion mode field effect transistor (FET) connected to a low side depletion mode FET at a switch node;
a high side coupling capacitor coupling the high side driver to the high side depletion mode FET, and a low side coupling capacitor coupling the low side driver to the low side depletion mode FET;
an FET switch configured to couple the input DC voltage to the high side depletion mode FET;
a bypass capacitor connected to the FET switch and the high side depletion mode FET at one end and to a reference voltage at another end;
a first transistor connected to the high side depletion mode FET and the high side coupling capacitor at one end and connectable to a first supply voltage at another end; and
a second transistor connected to the low side depletion mode FET and the low side coupling capacitor at one end and connectable to a second supply voltage at another end;
wherein in a first state:
the FET switch is in an OFF state, thereby electrically isolating the input DC voltage from the high side depletion mode FET;
the first transistor is in an ON state, thereby charging the high side coupling capacitor; and
the second transistor is in ON state, thereby charging the low side coupling capacitor.

2. The electronic circuit of claim 1, wherein the first supply voltage and the second supply voltage are negative supply voltages.

3. The electronic circuit of claim 2, further comprising a controller element configured to monitor voltages of the high side coupling capacitor and/or the low side coupling capacitor to generate a first and/or a second monitored voltage.

4. The electronic circuit of claim 3, wherein the controller element is further configured to turn the first transistor and/or the second transistor to an OFF state after the first and/or the second monitored voltages reaches a first and/or a second threshold voltage.

5. The electronic circuit of claim 4, wherein in the first state:
the high side coupling capacitor is configured to be charged based on a comparison of a high side capacitor voltage with the first threshold voltage, and
the low side coupling capacitor is configured to be charged based on a comparison of a low side capacitor voltage with the second threshold voltage.

6. The electronic circuit of claim 5, further comprising a monitoring circuit coupled to the bypass capacitor and configured to monitor a DC voltage at the one end of the first transistor to ensure that the DC voltage is lower than a set threshold voltage.

7. The electronic circuit of claim 6, configured to be coupled to a load tolerating a maximum load voltage.

8. The electronic circuit of claim 7, wherein the set threshold voltage is set to be less than or substantially equal to the maximum load voltage.

9. The electronic circuit of claim 8, the load being coupled to the switch node through a low pass filter.

10. The electronic circuit of claim 9, wherein the low pass filter comprises one or more inductors and one or more capacitors.

11. The electronic circuit of claim 10, wherein during a second state:
the FET switch is in an ON state, thereby passing the input DC voltage to the high side depletion mode FET; and
the high side driver and the low side driver control the high side depletion mode FET and the low side depletion mode FET.

12. The electronic circuit of claim 1, wherein the first supply voltage and the second supply voltage comprise charge pumps.

13. The electronic circuit of claim 1, wherein the first supply voltage and the second supply voltage are implemented on a same chip.

14. The electronic circuit of claim 1, wherein the first supply voltage and the second supply voltage are implemented on separate chips.

15. A method of starting up or restarting a circuit configured to receive an input DC voltage, the circuit comprising:
- a high side depletion mode FET connected to a low side depletion mode FET at a switch node;
- a high side coupling capacitor connected to the high side depletion mode FET at one end and to a high side driver at another end;
- a low side coupling capacitor connected to the low side depletion mode FET at one end and to a low side driver at another end; and
- an FET switch connected to the input DC voltage at a first end and to the high side depletion mode FET at a second end, the method comprising:

turning the FET switch off;

monitoring a DC voltage at the second end;

based on the monitoring, when the DC voltage at the second end is less than a threshold voltage:

- charging the high side coupling capacitor thereby enabling the high side driver to control the high side depletion mode FET to be in an OFF state; and
- charging the low side coupling capacitor thereby enabling the low side driver to control the low side depletion mode FET to be in an OFF state.

16. The method of claim 15, further comprising:

connecting a first transistor to the high side coupling capacitor and the high side depletion mode FET at one end, and to a first charge pump at another end;

connecting a second transistor to the low side coupling capacitor and the low side depletion mode FET at one end, and to a second charge pump at another end.

17. The method of claim 16, wherein:

the charging the high side coupling capacitor is performed by turning ON the first transistor; and the charging of the low side coupling capacitor is performed by turning ON the second transistor.

18. The method of claim 17, further comprising turning the first transistor and the second transistor OFF, upon voltages of the high side coupling capacitor and the low side coupling capacitor reaching a voltage threshold.

* * * * *